United States Patent [19]

Levine

[11] 4,359,779
[45] Nov. 16, 1982

[54] FM TRANSMITTER WITH FREQUENCY RAMP PHASE AND AMPLITUDE CORRECTION MEANS

[75] Inventor: Arnold M. Levine, Chatsworth, Calif.

[73] Assignee: International Telephone and Telegraph Corporation, New York, N.Y.

[21] Appl. No.: 214,092

[22] Filed: Dec. 8, 1980

[51] Int. Cl.³ .............................................. H04B 1/02
[52] U.S. Cl. .................................... 455/110; 332/18; 375/1; 343/17.2 PC; 455/126
[58] Field of Search ................. 455/42, 110, 113, 116, 455/119, 126; 332/18, 19; 343/17.2 R, 17.2 PC, 17.5, 14; 375/1

[56] References Cited

U.S. PATENT DOCUMENTS 3,679,983 7/1972 Theriot ..................... 343/17.2 PC
3,900,823 8/1975 Sokal et al. ..................... 455/126

*Primary Examiner*—Marc E. Bookbinder
*Attorney, Agent, or Firm*—William T. O'Neil

[57] ABSTRACT

A system including a frequency ramp generator feeding a transmitting power amplifier and antenna through a phase modulator and gain-controllable, transmitter driver stage. The frequency ramp generated is sampled out through a wide band delay-line feeding a phase comparator, the other comparison input to the phase comparator being provided by a sampling probe at the transmitting power amplifier output. The phase comparator output is used as a phase correction signal applied to the phase modulator and an amplitude modulation detector also responsive to the signal on the transmitting power amplifier output provides a feedback signal controlling the gain of the transmitter driver on a high bandwidth basis. Accordingly, instantaneous and long term frequency ramp phase and amplitude variations are substantially cancelled out so that the power amplified output is an accurate replica of the originally generated frequency ramp.

6 Claims, 3 Drawing Figures

FM TRANSMITTER WITH FREQUENCY RAMP PHASE AND AMPLITUDE CORRECTION MEANS

BACKGROUND OF THE INVENTION

1. FIELD OF THE INVENTION

The invention relates to frequency modulated or "chirp" transmitters such as employed in FM radar systems.

2. DESCRIPTION OF THE PRIOR ART

In the prior art, frequency modulation radar both of the linear and non-linear types is well known. The use of frequency modulation in both CW and pulsed radar has been extensively described in the technical literature. In an early form, frequency modulation was applied to CW radars in order to provide a means of range determination. In such radars, the continuously varying frequency of the transmitter waves provided a reference against which the time function (frequency versus time) of an echo signal was shifted with respect to the transmitted signal. In linear FM, the greater this shift, the greater the range of a given target.

The frequency modulation concept in radar has also been used to effect pulse compression. In accordance with that concept, a relatively long pulse may be transmitted and frequency modulated to provide a relatively large amount of power on target. Echo signals are passed through a matched filter (a dispersive delay line, for example ) so that the received pulses can be effectively narrowed. This technique is described in the technical literature including the text "Radar Handbook" by Merrill Skolnik (McGraw Hill, 1970), chapter 20 in particular. Chapter 2 of the text "Modern Radar, Analysis Evaluation, and System Design" by Raymond S. Berkowitz also provides a background in the FM pulse compression art.

One of the key problems associated with the use of FM swept pulses (sometimes referred to as "chirp"), is the problem of preserving the integrity of the FM function (frequency ramp) from ramp generator to antenna. The problem is particularly acute in wide band systems, i.e. systems in which the transmitter is pulsed with a wide band chirp. Parasitic oscillations and other extraneous signal effects may be produced in the components between the chirp generator and the antenna. Also, power sources may vary, tuning may change with temperature or material surface characteristics and the basis linearity of power amplification components cannot be assumed to be invariant.

It will be immediately realized that any such variation will tend to deteriorate the match between transmission and reception characteristics which is vital to FM chirp integrity. Range information derived from such a system can be subject to inaccuracy and scan patterns in frequency scan systems will tend to exhibit angle errors.

Highly stable and ultra-linear frequency ramp generators have been developed for the radar arts so that it is possible in the current state of the art to produce a frequency ramp in which the rate of change df/dt (where F is frequency and T is time) is constant to a very high degree of accuracy.

U.S. Pat. No. 4,038,612 describes one particularly sucessful apparatus for generating a highly linear frequency ramp. That device is also adapted to the generation of a non-linear freqwuency ramp since it responds to a repetitive digital program which times the zero crossings of the individual waves in the frequency ramp.

The manner in which the present invention advances the art by providing for preservation of the integrity of a frequency ramp once generated, as it passes through a power amplifier and other transmitting components responsive thereto, will be understood as this description proceeds.

SUMMARY OF THE INVENTION

The invention relates to frequency-modulated radio frequency transmitting systems such as are known in the radar art. The invention is applicable and useable either in the FM ranging art employing relatively long cyclical frequency ramps as the transmitted signal, or the invention likewise is applicable to basic pulse radar systems in which the frequency ramp is superimposed on the transmitted RF pulse, such as frequently employed in pulse compression systems of the FM type.

The invention deals with phase and amplitude variations and distortions imposed on the basic frequency ramp which itself may be generated by any of the various known generators of high fidelity frequency ramps such as described in the previously identified U.S. Pat. No. 4,038,612.

In a combination of the invention, the usual transmitter power amplifier and driver stages are assumed to be cascaded between the frequency ramp generator and antenna of the system. An RF probe at the RF power amplifier/antenna connection diverts a very small fraction of the output power to an amplitude modulation detector and in parallel to one input of a phase comparator. In this phase comparator the frequency ramp generator signal delayed to compensate for the nominal delay of the transmitting component chain is compared against the aforementioned probe signal to produce a phase control signal applied to a phase modulator inserted in the transmitting component chain. In parallel, detected amplitude modulation on the probe signal is used to control the gain of a transmitter driver stage in a time domain slow compared to the individual RF cycles, but rapid compared to the duration of a frequency ramp cycle.

In accordance with the invention, the integrity of the transmitted FM (chirp) signals is greatly enhanced and errors due to variations occurring in the transmitter component chain are significantly reduced or eliminated.

A more detailed description of the implementation of the present invention follows.

DETAILED DESCRIPTION OF THE PREFERRED EMBODIMENT

Figure 1:
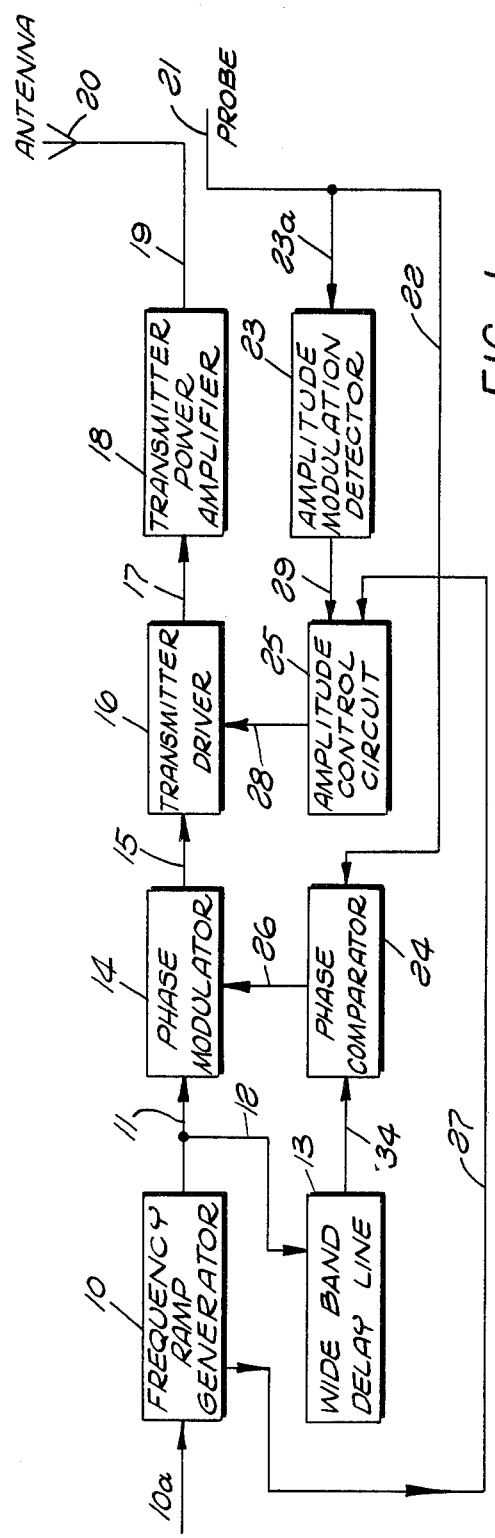
FIG. 1 is a circuit block diagram of a system for implementing the invention.

Referring now to FIG. 1, the frequency ramp generator 10 is of a known type such as, for example, the previously identified device of U.S. Pat. No. 4,038,612. The ramp generator 10 is under the control of a synchronizing pulse on 10a which determines its cycling rate and time in a well known manner. Accordingly on outputs leads 11 and 12 a signal is provided which continuously varies in frequency throughout each cycle of its operation, but is of substantially constant amplitude.

Frequently, the function of frequency versus time in the frequency ramp generated and extant on 11 and 12 is a linear function, however, the present invention is equally adapted to non-linear frequency ramps as well as linear ones. The aforementioned U.S. Pat. No. 4,038,612 describes a frequency ramp generator which may be said to be digitally programmed, that is specific waves of the RF signal are digitally timed at discrete zero crossings. Accordingly, a linear (or any smooth ramp function) can be accurately generated as required.

A wideband delay line 13 provides a delayed replica of the frequency ramp output at 12, the amount of the delay being selected to equal the nominal delay or phase shift encountered in the transmitting component chain between leads 11 and 19. Thus, if that particular chain of components between 15 and 19 were entirely free of phase distortion, no signal would be extant on 26 for controlling the phase modulator 14. Since such freedom from phase distortion is not probable, and in fact since one purpose of the present invention is to correct for such phase distortion, a signal may be expected to be extant on 26 which would be at the same RF frequency for instantaneous phase control in the phase modulator 14. The phase comparator 24 responsive to the RF output signal via probe 21 and wideband amplifier 13, may be thought of as being equivalent to a phase discriminator except that the output at 26 is not integrated or filtered significantly. If a low pass filter were employed in phase comparator 24, its time constant would be expected to be such that the control of phase modulator 14 to correct for a given phase distortion condition could take place within a few cycles of the RF signal. The transmitter driver 16 is essentially a buffer amplifier except that it is responsive to a gain setting control signal on lead 28.

Going back to the probe 21, which samples essentially the same RF signal as radiated by antenna 20, it will be noted that an amplitude modulation detector 23 responsive to the aforementioned probe signal at lead 23a is provided. The amplitude modulation detector would normally have a low pass characteristic so that the output signal on 29 is effectively integrated over a number of cycles of the RF wave, typically such that amplitude modulation extant on the RF signal at 23a is extant at 29, however the low pass filtering within 23 is such that the RF signal (carrier) is supressed to a high order of effective attenuation. Amplitude control circuit 25 will be discussed in more detail in connection with FIG. 2, however, the operation of amplitude control circuit 25 may be summarized at this point as providing a signal on lead 28 for gain control of transmitter driver 16 in accordance with a predetermined balance between signals extant on 23a and 27. Thus the amplitude at lead 19 is controlled to a predetermined level. This amplitude control structure and function will be recognized as an adaptation of negative feedback for this specific purpose. The structure of the phase comparator 24, previously equated to a phase discriminator will be apparent to those of skill in this art. The wideband delay line 13 may advantageously be of the fiber optic type, particularly if the frequency ramp pulse duration and the extent of the FM excursion extant on lead 12 demands wideband response. Fiber optic delay lines per se are well known in the art and have been variously described in the technical literature. Basically they comprise a length of optical fiber as a predetermined delay light conductor, an electric-to-light transducer (such as a laser source or LED) at the input end of the length of optical fiber and a light-to-electric transducer at the output of the length of optical fiber. Such a delay line with input and output transducers is shown in FIG. 3, and is known as such. The usual thread-like optical fiber (optical waveguide) may be "spooled" to provide a required delay in a small space. Accordingly the very wideband capability of the optical fiber transmission medium is available in an electric input to an electric output device.

Figure 2:
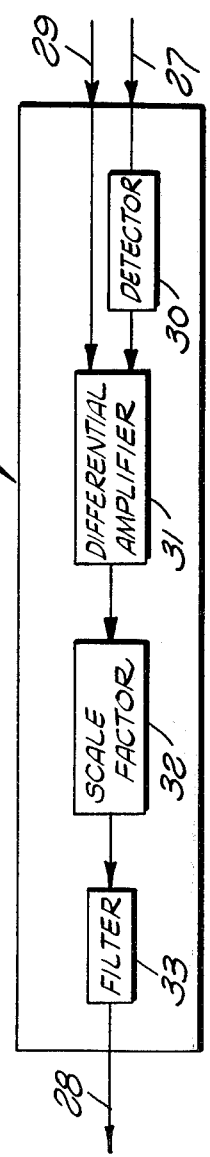
FIG. 2 is a detailed circuit block diagram of a typical amplitude control circuit as employed in FIG. 1.
Figure 3:
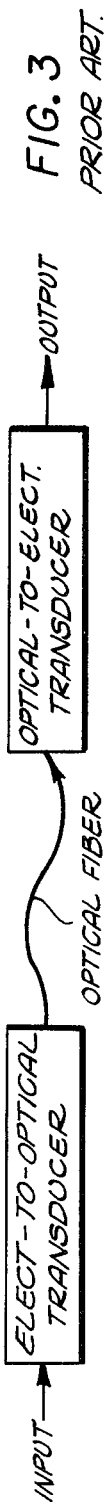
FIG. 3 is a schematic block diagram of a fiber optic delay line useable in the arrangement of FIG. 1.

Referring now to FIG. 2, a typical configuration of the amplitude control circuit 25 is depicted. Since the input on lead 29 is prior detected in detector 23, it can be applied directly to differential amplifier 31. In the case of the frequency ramp from the generator 10 by a lead 27, similar detection is necessary in detector 30. Thus, the two inputs to the differential amplifier 31 provide a differential amplifier output through scale factor circuit 32 and filter 33. As previously indicated, the output control signal on 28 would be low pass filtered so that the amplitude control loop established between leads 17 and leads 28 via 18, 23 and 25 does not respond to individual RF cycles but will respond to extraneous modulation and long and intermediate term amplitude variations at lead 19.

The scale factor circuit 32 may be adjustable or fixed, but in either case it will be seen to be a loop "tightness" control. It is assumed that differential amplifier 31 can contain whatever scale factor elements are necessary or desirable in view of different levels extant at 27 and 29. As hereinbefore indicated, the frequency ramp extant at leads 11, 12 and 27 is not necessarily a linear ramp, but nevertheless the circuit of FIG. 1 is equally applicable to any smoothly varying function of frequency versus time.

Modifications and variations will suggest themselves to those of skill in this art, once the invention is understood. Accordingly it is not intended that the drawings or specification should be regarded as limiting the invention, these being intended to be typical and illustrative only.

What is claimed is:

1. A frequency modulated, radio-frequency transmitting system comprising:
   a cyclically operating frequency ramp generator and a radio-frequency power amplifier having an input responsive to said frequency ramp and an output providing a power amplified replica of said frequency ramp;
   first means for providing a sample signal by diverting a fraction of the output signal of said power amplifier as a sample signal;
   second means including a gain controllable driver stage between said frequency ramp generator and said power amplifier;
   third means including an amplitude modulation detector responsive to said sample signal for generating and applying a gain control signal to said driver stage in a manner tending to cancel any amplitude modulation from said power amplifier output;
   fourth means including a phase modulator in series between said frequency ramp generator and said power amplifier;
   fifth means including a delay device, and a phase comparator, said phase comparator being responsive to said sample signal and to the output of said delay device, said delay device being responsive at its input to said frequency ramp generator, and the output of said comparator being a phase correction signal applied to said fourth means.

2. A system according to claim 1 in which said delay device is a broad-band delay device providing a delay substantially equal to that caused within said radio-frequency power amplifier.

3. A system according to claim 2 in which said delay device comprises an electric-to-optical input transducer, a length of optical waveguide responsive to said input transducer, and an optical-to-electric output transducer.

4. A system according to claim 1 in which said first means is a low-ratio RF coupler.

5. A system according to claim 1 in which filter means are associated with said amplitude modulation detector, said filter means providing a response time for amplitude modulation correction which is slow compared to the individual RF cycles, but rapid in respect to the frequency of recurrence of the cycles of said frequency ramp, to compensate for extraneous amplitude modulation occuring between said ramp generator and said first means.

6. A frequency modulated, radio-frequency transmitting system comprising:
 a cyclically operating frequency ramp generator and a radio-frequency power amplifier having an input responsive to said frequency ramp and an output providing said frequency ramp in power amplified form;
 first means for providing a continuous sample signal by diverting a fraction of the output signal of said power amplifier as a sample signal;
 second means including a gain-controllable driver stage between said frequency ramp generator and said power amplifier;
 third means including an amplitude modulation detector responsive to said sample signal for generating a gain control signal and applying it to said driver stage in a manner tending to cancel said amplitude modulation introduced extraneously between said ramp generator and said first means;
 fourth means including a phase modulator in series with said second means;
 fifth means including a fiber-optic delay device with input and output transducers and a phase comparator, said phase comparator being responsive to said sample signal and to the output of said delay device, said delay device being responsive at its input to said frequency ramp generator, the output of said phase comparator being a phase correction signal applied to said fourth means in a manner to tend to cancel phase distortion introduced extraneously between said ramp generator output and said first means.

* * * * *